(12) United States Patent
Finger

(10) Patent No.: US 6,456,043 B1
(45) Date of Patent: Sep. 24, 2002

(54) METHOD OF DIAGNOSING THE STATE OF HEALTH OF A BATTERY

(75) Inventor: Eugene P. Finger, Brewster, NY (US)

(73) Assignee: Curtis Instruments, Inc., Mt. Kisco, NY (US)

( * ) Notice: Subject to any disclaimer, the term of this patent is extended or adjusted under 35 U.S.C. 154(b) by 0 days.

(21) Appl. No.: 09/907,832

(22) Filed: Jul. 19, 2001

Related U.S. Application Data

(62) Division of application No. 09/716,116, filed on Nov. 17, 2000, now Pat. No. 6,362,601.

(51) Int. Cl.[7] .......................... A02J 7/14; G01N 27/416
(52) U.S. Cl. ....................................... 320/134; 324/427
(58) Field of Search .......................... 320/137, 132, 320/130, 134; 324/427, 426

(56) References Cited

U.S. PATENT DOCUMENTS 6,002,238 A * 12/1999 Champlin .................. 320/134
6,037,777 A * 3/2000 Champlin .................. 324/430
6,313,607 B1 * 11/2001 Champlin .................. 320/132

* cited by examiner

Primary Examiner—Gregory Toatley
(74) Attorney, Agent, or Firm—John H. Crozier

(57) ABSTRACT

In one preferred embodiment of the invention, a method of restoring charge to a battery operating with a predetermined terminal voltage, including: determining an expected rate of degradation of a plate or plates of a battery in terms of decrease of capacity per unit time and temperature of operation of the battery to determine a degree of degradation of capacity of the battery; and providing sufficient charge to the battery to restore a predetermined degree of the capacity of the battery. In another preferred embodiment of the invention, a method of diagnosing state of health of a battery, including: restoring a theoretical amount of charge to a partially depleted battery; and examining how the battery responded to the step of restoring a theoretical amount of charge to the partially depleted battery to determine the state of health of the battery.

5 Claims, 8 Drawing Sheets

Commutated Current Source

Example: Duty Cycle of Charge Restoration

Commuted Current Source Serving Two
Isolated Parallel Strings

Pulse Burst Charge Restoration

Approximate Float Current Versus Float Voltage for a New 100 Ampere Hour Cell @ +22°C $I_F = 0.2e^{19(E_F - 1.922)}$ mA

METHOD OF DIAGNOSING THE STATE OF HEALTH OF A BATTERY

CROSS-REFERENCE TO RELATED APPLICATION

The present application is a divisional of application U.S. patent application Ser. No. 09/716,116, filed Nov. 17, 2000, and titled METHOD OF BATTERY CHARGE RESTORATION BASED ON ESTIMATED BATTERY PLATE DETERIORATION AND/OR BASED ON BATTERY STATE OF HEALTH, now U.S. Pat. No. 6,362,601, issued Mar. 26, 2002.

BACKGROUND OF THE INVENTION

1. Field of the Invention

The present invention relates to generally and, more particularly, but not by way of limitation, to a novel method of battery charge restoration based on estimated battery plate deterioration and/or based on battery state of health.

2. Background Art

When used herein in connection with a battery, the term "plate" refers to a battery electrode, regardless of configuration.

While the present invention has been described principally with respect to a float charging system, it will be understood that the invention may be applied as well to any situation in which a battery or batteries can be suitably modeled in accordance with the principles of the invention.

As used typically in telecommunications power supply systems which require a precise and uninterrupted supply of electrical power, a bulk charger is connected to furnish a predetermined voltage across a voltage-controlled load. To ensure uninterrupted power, one or more strings of batteries are also connected across the load to supply power in the event of an outage of the bulk charger, the string or strings of batteries in this configuration comprising part of a "float charging system".

In the past, when flooded batteries were employed in air conditioned environments, such systems were very reliable and produced a very precise voltage. Today, many such installations, particularly the smaller ones which have recently proliferated, have replaced the flooded batteries with valve-regulated, lead-acid ("sealed") (VRLA) batteries. The principal reason for the change is elimination of maintenance. Also, again particularly in smaller installations, it is desirable for packaging reasons to lay the batteries on their sides. An ancillary benefit of this arrangement is that the batteries have a longer life when placed on their sides because of the lower specific gravity gradient across the batteries.

In such installations, the typical method of charging the batteries is to bulk charge all the batteries continuously at a float voltage. If necessary, the bus voltage can be raised. The latter is undesirable for a number of reasons, not the least of which is that the elevated bus voltage tends to stress the electrical and electronic components of the system and particularly the contactors in the load system. Alternatively, one or more of the batteries could be taken out of service and charged, but this requires additional maintenance effort. Another alternative is to try to balance the voltage to minimize both positive plate corrosion and negative plate self-discharge. However, one is faced with the problem of holding the bus voltage a bit high and causing corrosion of the positive plate of the battery or holding the bus voltage a bit low and causing self-discharge of the negative plate of the battery. If the self-discharge is serious enough, battery capacity can drop, and the negative plate can ultimately experience severe and irreversible sulphation. Fortunately, neither the corrosion nor the self-discharge process is terribly injurious if it occurs for only a small percentage of the running time of a battery.

Some attempts to prevent self discharge or to reduce the difference between the positive and negative plates have included the use of catalysts and the use of special alloys.

Accordingly, it is a principal object of the present invention to provide a method of charge restoration based on calculation of the degradation of a battery operating with a predetermined terminal voltage that does not require taking batteries off-line nor, preferably, raising the bus voltage.

It is a further object of the invention to provide such a system that operates at a voltage designed to "balance" positive plate corrosion and negative plate self-discharge.

It is an additional object of the invention to provide such a system in which the calculation of degradation of the battery includes such factors as temperature of operation, length of time of operation of the battery, battery calendar age, and/or type of discharges to which the battery is subjected.

It is another object of the invention to provide a system in which measurement of terminal voltage after a charge restoration can be used to indicate the state of health of the battery.

A further object of the invention is to provide such a system that operates at a relatively low duty cycle such that it is available to service a number of strings of batteries.

Other objects of the present invention, as well as particular features, elements, and advantages thereof, will be elucidated in, or be apparent from, the following description and the accompanying drawing figures.

SUMMARY OF THE INVENTION

The present invention achieves the above objects, among others, by providing, in one preferred embodiment of the invention, a method of restoring charge to a battery operating with a predetermined terminal voltage, comprising: determining an expected rate of degradation of a plate or plates of a battery in terms of decrease of capacity per unit time and temperature of operation of said battery to determine a degree of degradation of capacity of said battery; and providing sufficient charge to said battery to restore a predetermined degree of said capacity of said battery. In another preferred embodiment of the invention, a method of diagnosing state of health of a battery, comprising: restoring a theoretical amount of charge to a partially depleted battery; and examining how said battery responded to said restoring a theoretical amount of charge to said partially depleted battery to determine said state of health of said battery.

BRIEF DESCRIPTION OF THE DRAWING

Understanding of the present invention and the various aspects thereof will be facilitated by reference to the accompanying drawing figures, submitted for purposes of illustration only and not intended to define the scope of the invention, on which.

DETAILED DESCRIPTION OF THE PREFERRED EMBODIMENTS

Figure 1:
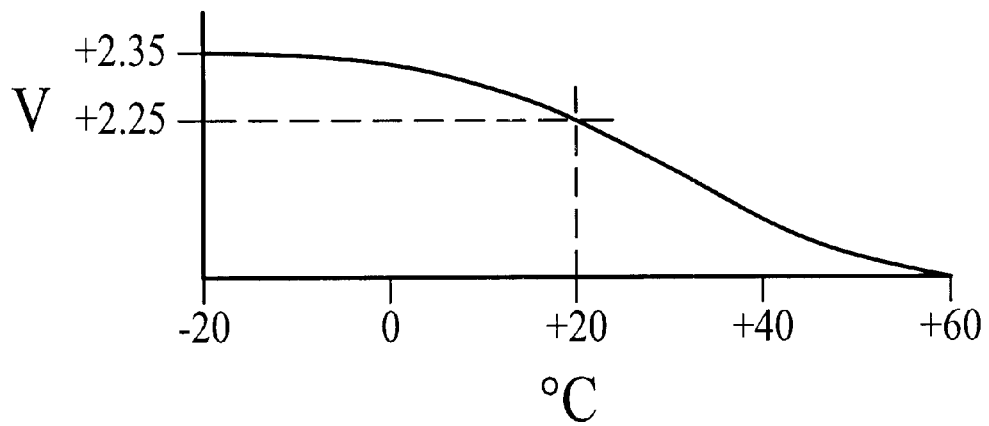
FIG. 1 is a graph of battery cell voltage versus temperature in a system with float voltage optimized to maintain positive plate polarization with minimum corrosion for a VRLA battery.

While the present invention models and calculates the degree of self-discharge of the negative plate of a battery to determine the degree of charge restoration required, the same technique can be employed using corrosion of the positive plate or degradation of both plates as parameters, providing that the same can be appropriately modeled. Likewise, the diagnosis feature of the present invention can be applied wherever the charge restoration response of the battery can be modeled.

In its optimized form, the system of the present invention will extend the life of a battery (and particularly a VRLA battery) in a float charge system, while reducing the voltage stress on system components, and while providing battery diagnostics (state-of-health). The system circumvents a "delicate balance" of plate polarization, which is particularly troublesome in VRLA batteries, and actually uses plate depolarization to advantage as a self-discharge mechanism which, when characterized, dictates when a commutated charge restoration sequence will take place. This charge restoration sequence then serves as the stimulus for examining individual cells or groups of cells ("modules") under dynamic conditions as opposed to examination under float conditions. The dynamic response is compared to the predicted response as a means for assessing the health of the cell or module undergoing charge restoration. The stimulus can be extended or altered to assist cells or modules which are depolarizing faster than predicted. The system can also assist in charge restoration after a discharge event by, for example, providing an extra charge cycle or by charging at a higher-than-normal current level or for a longer-than-normal period of time.

Reference should now be made to the drawing figures, on which similar or identical elements are given consistent identifying numerals throughout the various figures thereof, and on which parenthetical references to figure numbers direct the reader to the view(s) on which the element(s) being described is (are) best seen, although the element(s) may be seen also on other views.

As noted above, a float charging system may comprise one to a number of parallel battery strings. One method of restoring charge of the system is to bulk charge the entire system, with temperature compensation, in a manner that assures fully charging the VRLA batteries positive plates without causing excessive positive plate corrosion. This is shown on FIG. 1 which illustrates charging voltage per cell versus temperature for a VRLA battery float charging system, optimized to maintain positive plate polarization with minimum corrosion.

The negative plate of a VRLA battery will usually self-discharge when the float voltage is held at the relatively low level which satisfies the optimum condition illustrated on FIG. 1 and which ensures a "balanced" condition in which there is minimal positive plate corrosion and little negative plate self-discharge. This self-discharge is a strong function of voltage and temperature. These functions and relationships usually shift over time and use. In the basic strategy of the present invention, the negative self-discharge is modeled as an integral equation of voltage and temperature with respect to time, as is illustrated on FIG. 2, which shows the decrease in capacity per time versus temperature.

Figure 2:
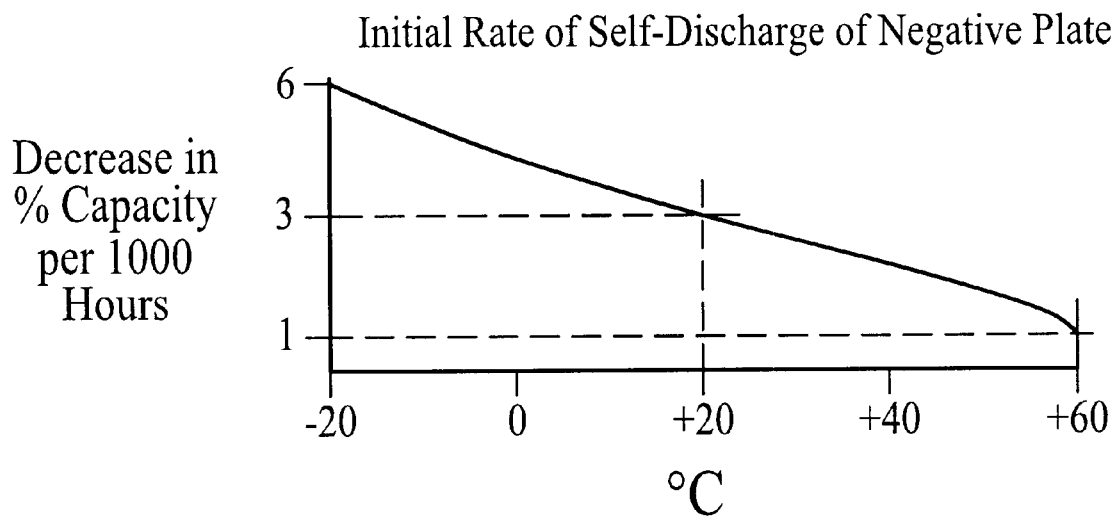
FIG. 2 is a graph of decrease in capacity versus temperature for the initial rate of self-discharge of a negative battery plate.
Figure 3:
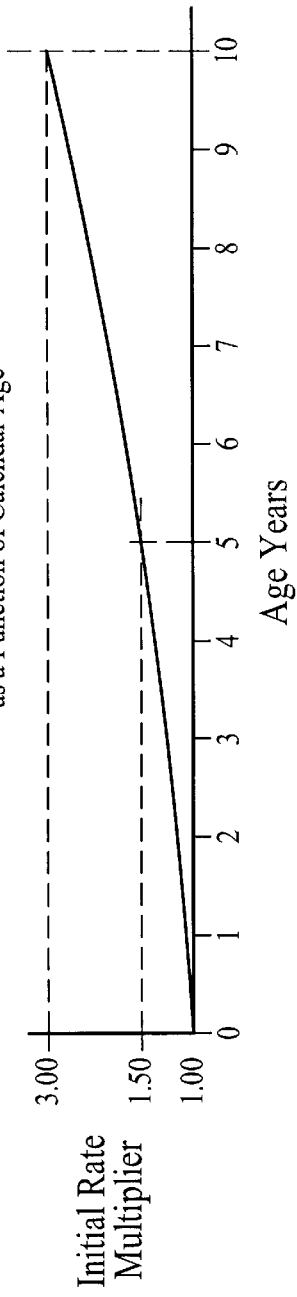
FIG. 3 is a graph of initial rate multiplier versus time for the rate of self-discharge of a negative battery plate.

A further advanced model of this function includes calendar time, recognizing an estimate of the shift in the relationships and functions with respect to age, as is illustrated on FIG. 3 which shows the increase in rate of self-discharge of the negative plate as a function of calendar age and gives a multiplier to be applied to the data of FIG. 2.

Figure 4:
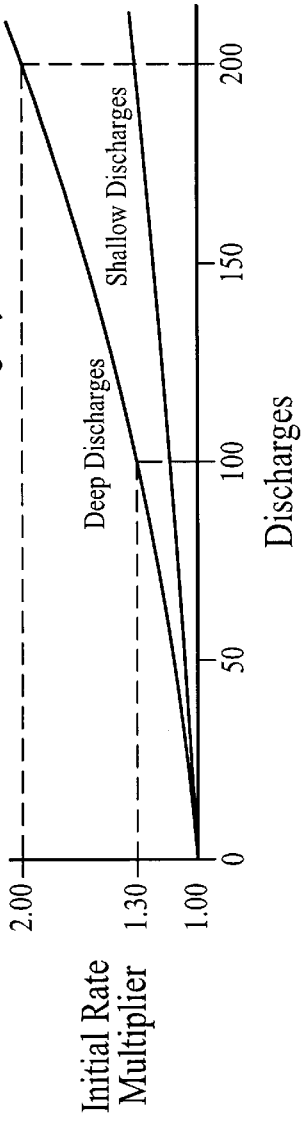
FIG. 4 is a graph of initial rate multiplier versus time for the rate of discharge as a function of discharge levels.

Another advanced model of this function also includes use, recognizing an estimate of the shift in the relationships and functions with respect to discharge/recharge activity, especially deep discharges, as is illustrated on FIG. 4 which shows the increase in rate of self-discharge as a function of types of discharge cycles, with deep discharge cycles causing a greater increase in the discharge rate, and which give a multiplier to be applied to the data of FIG. 2.

Figure 5:
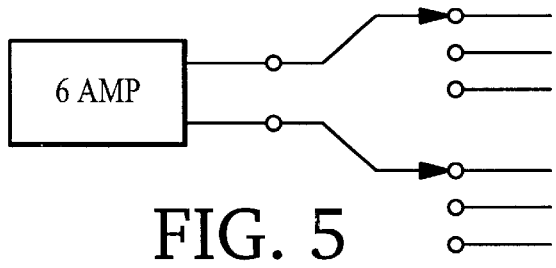
FIG. 5 schematically shows a commutated current source for a string of battery cells or modules.
Figure 6:
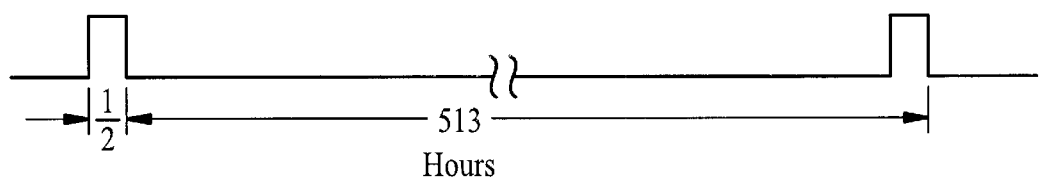
FIG. 6 is a waveform showing an example of charge restoration duty cycle.

The restoration of the discharged capacity of the negative plate is performed by a single commutated power source, preferable operating as a current source, but it may be a voltage source or a current/voltage source, as is illustrated schematically on FIG. 5. The need to perform a restoration is dictated by the self-discharge function discussed above. This power source is active for only a very short period of time relative to calendar time, as is illustrated on FIG. 6 which shows the duty cycle for the following example:

—From FIG. 2, there has been a 3% decrease in capacity over 1000 hours at 20° C.
—From FIG. 3, the rate multiplier at 5 years is 1.50.
—From FIG. 4, the rate multiplier for 100 deep discharges is 1.30.
—Therefore, the final rate=3% per 1000/(1.50×1.30)= 512.8 hours.
—3% restoration of a 100 Ah cell=3 Ah.
—Therefore, with a 6-Amp constant current charges, each recharge pulse will be ½ hour long (plus overcharge, if desired).

Figure 7:
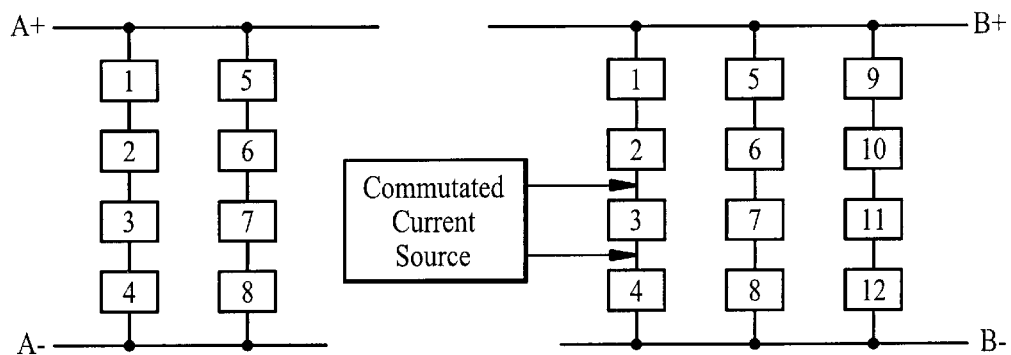
FIG. 7 schematically shows a commutated current source servicing two, isolated, parallel strings of battery cells or modules.

Because the power source is active for only a short period of time, the effect on positive plate corrosion is relatively small over the life of the battery. Also because the power source is active for only a short period of time, the power source is available for servicing a large number of cells or modules, even cells or modules in parallel strings, and even cells or modules in independent or isolated strings, as is illustrated on FIG. 7. For the example shown and assuming charging per FIG. 6, the commutated current source services a total of 20 modules which requires only 10 hours out of the calculated 513 hour interval. There could also be separate load and source with a common commutated current source.

While the present invention can accommodate battery degradation over a fairly large range, it is probably optimum that battery degradation fall in the range of 5–10 percent of discharge. This is high enough that the charge restoration is significant enough to have a measurable effect on the battery, but not high enough to significantly degrade the battery or consume a large amount of time of the auxiliary charger.

It would be understood that, if there is a power outage and bulk recharging following the power outage, it may be advantageous to re-initiate the commutation cycle only after an appropriate stabilization time for the cells that had not been previously addressed in the commutation cycle preceding the power outage.

Figure 8:
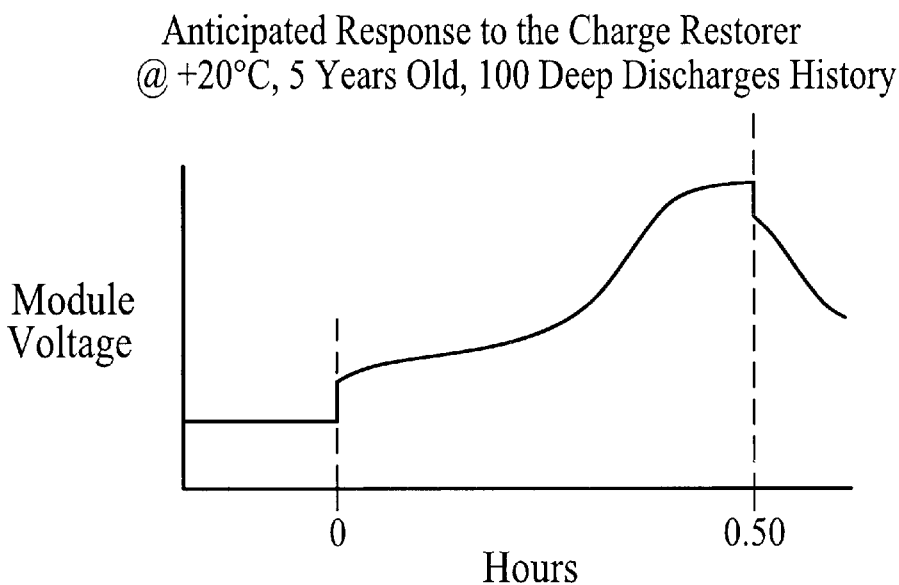
FIG. 8 is a graph of module voltage versus time, illustrating the anticipated charge restoration response for a battery module having a particular history.

Because the state of the positive plate is optimumly held at full charge, and the discharge state of the negative plate is reasonably estimated by the above self-discharge function, it becomes possible to create a charge response function which characterizes how the cell or module should respond with respect to the charge restoration stimulus. This predicted charge response function accounts for temperature, the extent of negative plate self-discharge predicted by the above self-discharge function, and the nature of the commutated power source. FIG. 8 illustrates the anticipated, or predicted, response for a typical battery for the conditions indicated.

Figure 9:
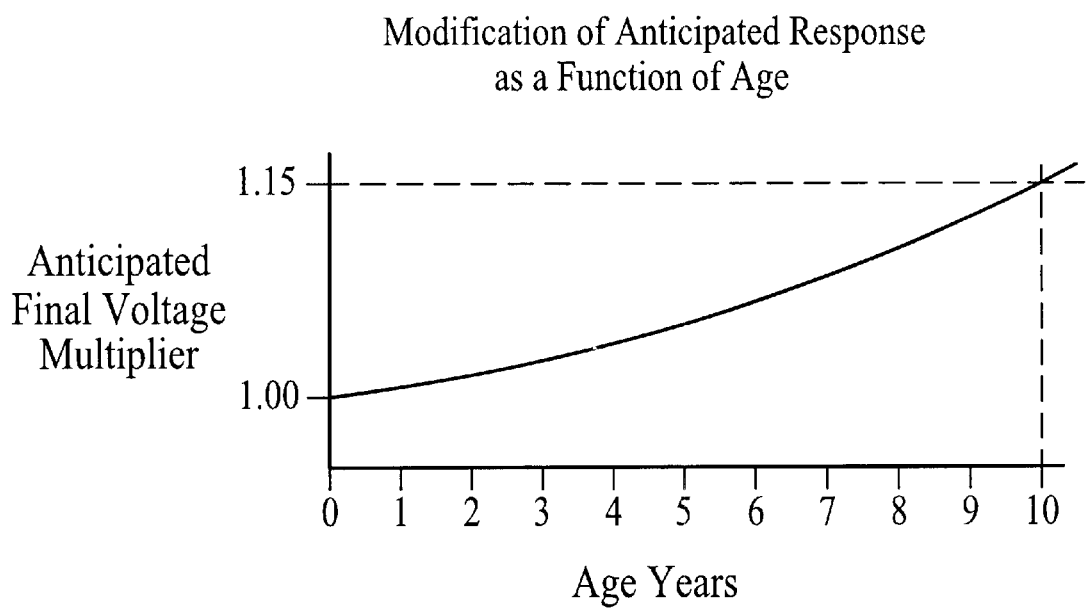
FIG. 9 is a graph giving a multiplier for the anticipated response of FIG. 8 as a function of module age.

The response curve illustrated on FIG. 8 can be modified as indicated on FIG. 9 to account for calendar time, recognizing an estimate of shifts in the voltage/current/temperature response as a result of ageing. The FIG. 8 response curve can also be modified to account for response shifts as a function of discharge-recharge activity, especially deep discharges, as is illustrated on FIG. 10.

Figure 10:
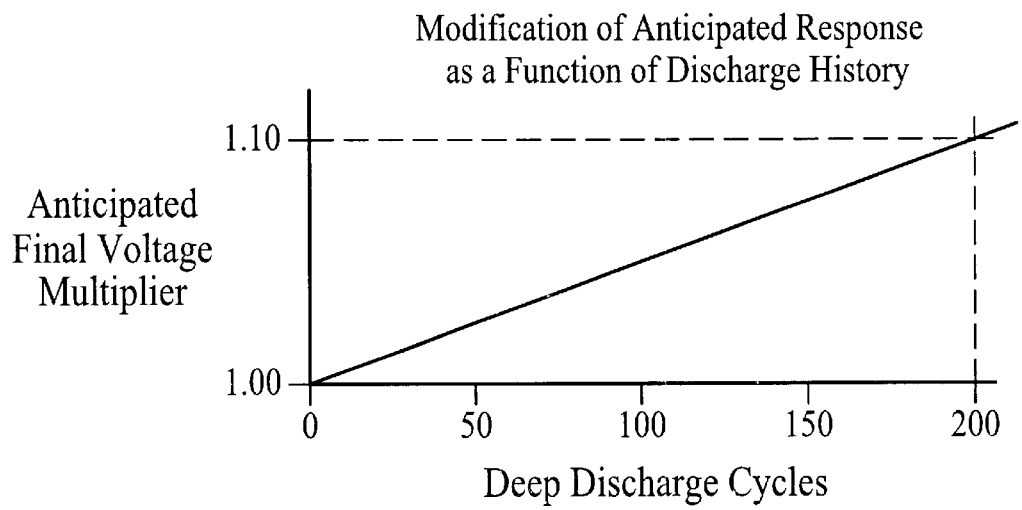
FIG. 10 is a graph giving a multiplier for the anticipated response of FIG. 8 as a function of discharge history.
Figure 11:
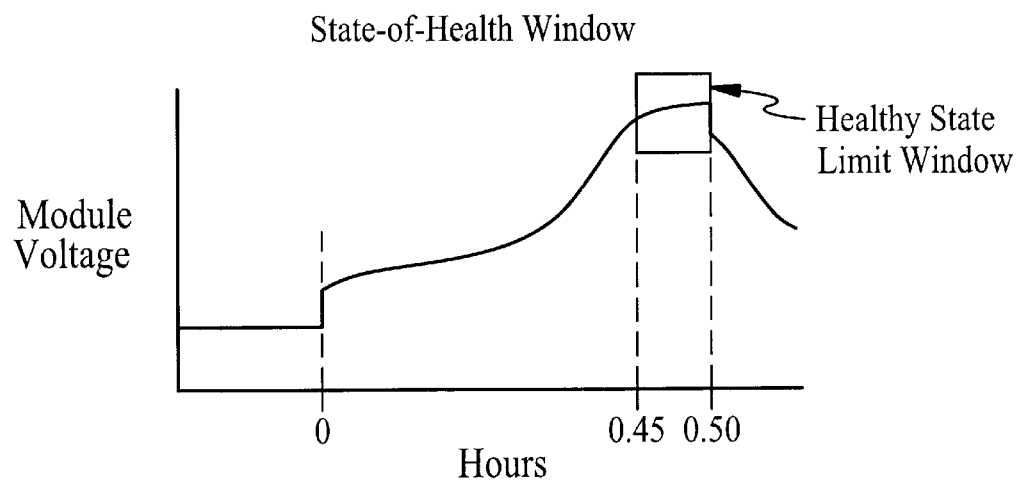
FIG. 11 is a graph of module voltage versus time and indicating a healthy state limit window.

FIG. 11 illustrates a FIG. 8 curve modified in accordance with FIGS. 9 and 10 and indicates a "healthy state limit window" at the end of the restoration charge. If the actual restoration charge response falls within this window, it may be assumed that the battery is healthy. The window could extend over more of the charge restoration curve, or it could extend over the entire charge restoration curve, if the shape of the entire curve has meaning as to the state of health of the battery under consideration.

When the commutated power source is active, the voltage across the cell or module receiving charge restoration rises above its normal float charge level and, in the preferred embodiment, the voltage across the remaining cells or modules in the series string, of which the cell or module receiving charge restoration is a part, drops, further increasing the negative plate self-discharge in those cells, and possibly starting some positive plate self-discharge. This occurs for only a relatively small portion of real calendar time and it can be computed by the self-discharge function by subtracting the instantaneous voltage of the cell or module receiving charge restoration from the total (bus) voltage to arrive at an average cell or module voltage for the remaining cells or modules. Such a system, in which the bus voltage is held constant, is illustrated on FIG. 12 where the bus voltage is held constant at 52.80 VDC.

Figure 12:
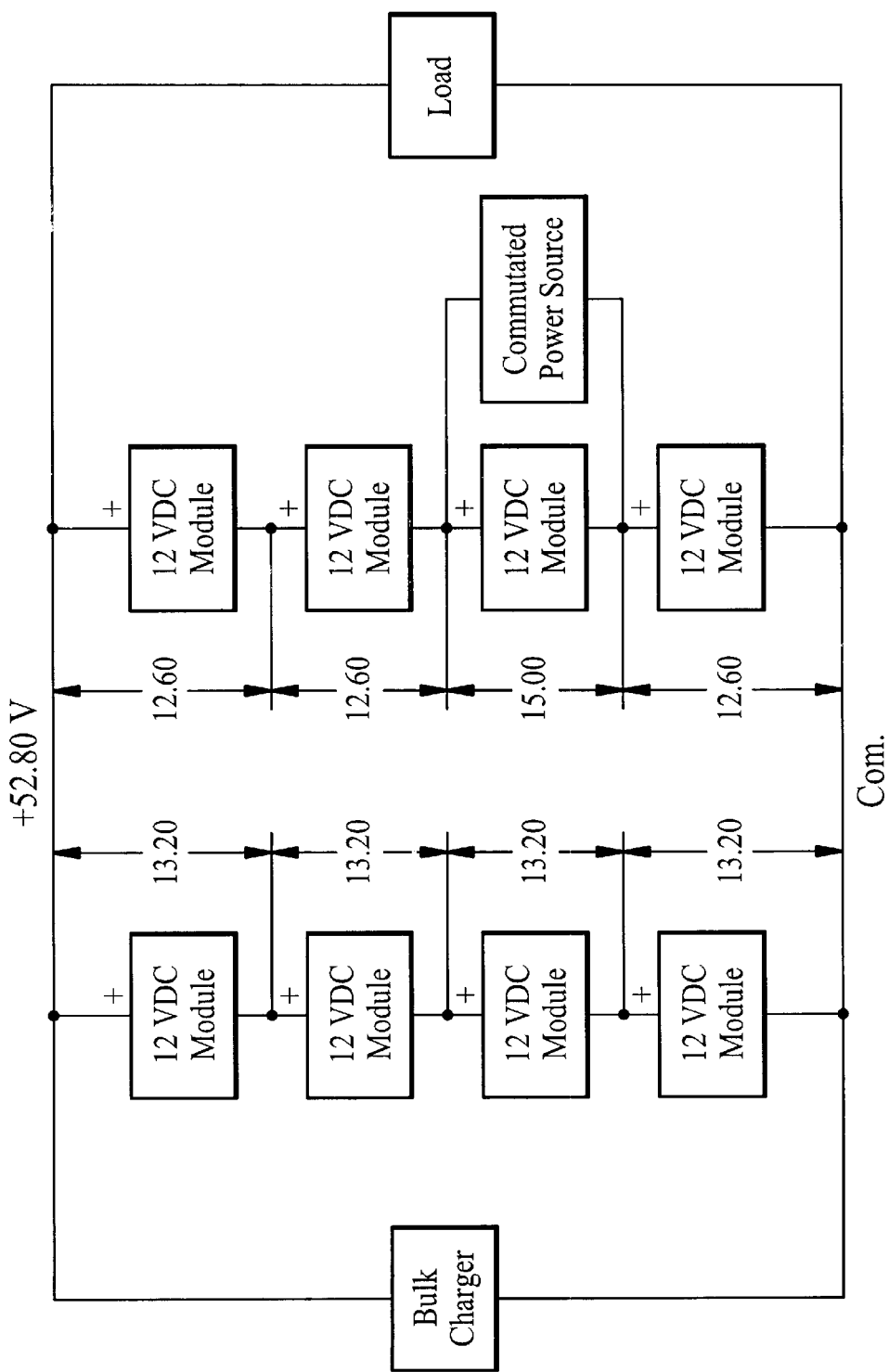
FIG. 12 schematically shows a float charging system in which bus voltage is held at its usual level during charge restoration of a module.
Figure 13:
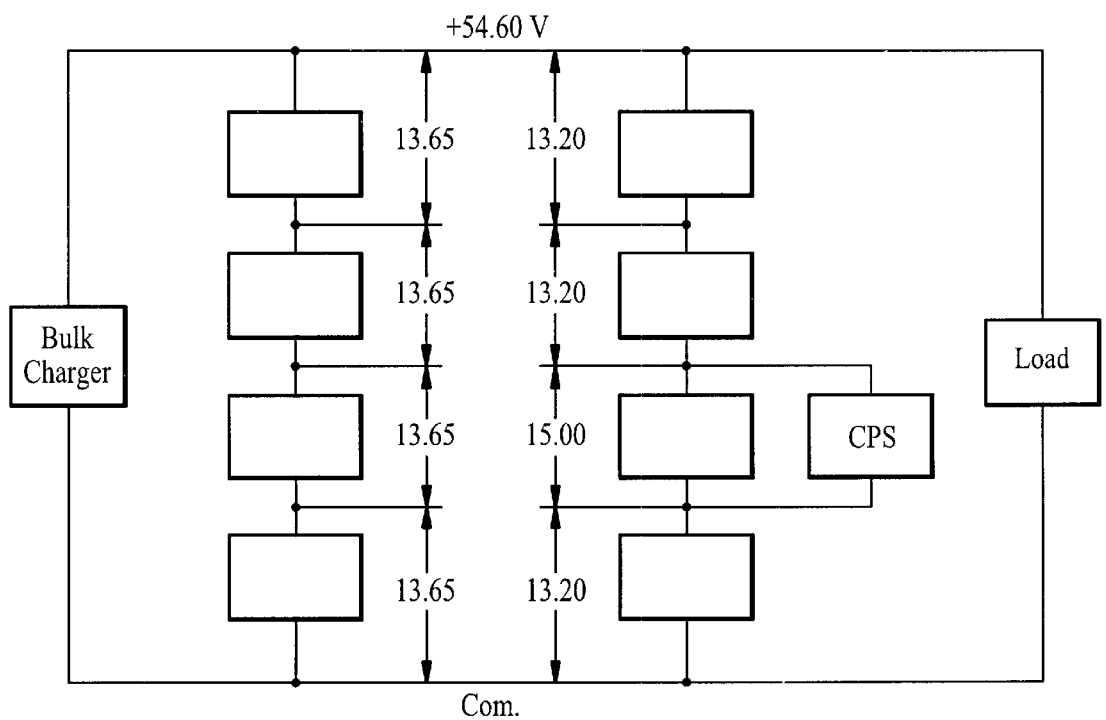
FIG. 13 schematically shows a float charging system in which bus voltage is raised slightly during charge restoration of a module.

Although the arrangement illustrated on FIG. 12 is preferred, since it is most desirable to hold the bus voltage constant or nearly so, the present invention contemplates it is not mandatory that the bus voltage be held constant. It is, however, undesirable to raise the system bus voltage to "boost" charge the entire set of batteries, as this could raise the bus to a highly stressful level, say, 60.00 VDC (4×15.00). FIG. 13 illustrates a practical compromise in which the bus is raised to 54.60 VDC. This holds the cells or modules in the string receiving charge restoration at their optimum normal float voltage except for the one receiving additional charge from the commutated power source. The cells or modules in any other, parallel string receive a moderate charge voltage increase. The bulk charger which establishes the bus voltage uses the measured voltage across the cell or module receiving charge restoration to calculate the new bus voltage. For example, on FIG. 13, Vbus always equals $13.20 \times 3 + V_{restoration}$ which equals 39.6+15.0=54.6 at the instant shown. Alternatively, the bulk charger could be instructed to raise the bus voltage to, say, 54 or 55 VDC (temperature compensated) anytime charge restoration is taking place, assuming the charge restoration voltage will be on the order of 14.4 to 15.4 VDC.

When the actual charge restoration response clearly reveals under-performance, the charge restorer can be instructed to prolong the charge, and/or increase current, to assist the underperforming module, while reporting the state-of-health deficiency. This "extra effort" will have time or time-and-current limits and a second reporting event can be provided if desired battery health is not achieved within the limits.

Theoretically, the system of the present invention should be able to operate over a very wide range of "real time". For example, instead of 0.5 hour out of 513 hours, the system could provide charge restoration for 0.05 hour out of 51.3 hours or 5 hours out of 5130 hours. However, this would shift the anticipated or predicted self-discharge to 0.3 percent and 30 percent, respectively, which could significantly alter the response to the stimulus. Likewise, there could be a wide latitude in current level. The choice of real time and current optimization should be driven by the need to provide a stimulus that both keeps the battery healthy and provides a meaningful diagnostic tool.

Although it is believed that charge restoration pulses having a time interval on the order of 0.5 to 1 hour are best for the system of the present invention, that does not preclude the possibility of reducing the time interval of pulses to seconds or even sub-seconds. For the example of FIG. 6, the time interval may be 1 second out of 1026 seconds. Going to a short pulse interval may encourage going to a higher pulse current, and the example might evolve to 1 second out of 3078 seconds at 18 amperes, instead of 1 second out of 1026 seconds at 6 amperes.

As a battery ages (even a very healthy one), the terminal voltage under charge may change significantly. If this voltage response leads to a voltage higher than desired for the system, a practical recourse can lie in the short pulse time domain. Two very practical possibilities emerge. The first is the shortened duty cycle as noted above. By going to short pulses at a higher repetition rate, the peak voltage will be inherently reduced, as the cell's dynamic voltage response entails time constants significantly greater than the pulse width; however, the diagnostics of interpreting the response may not be as good as with longer pulses.

Figure 14:
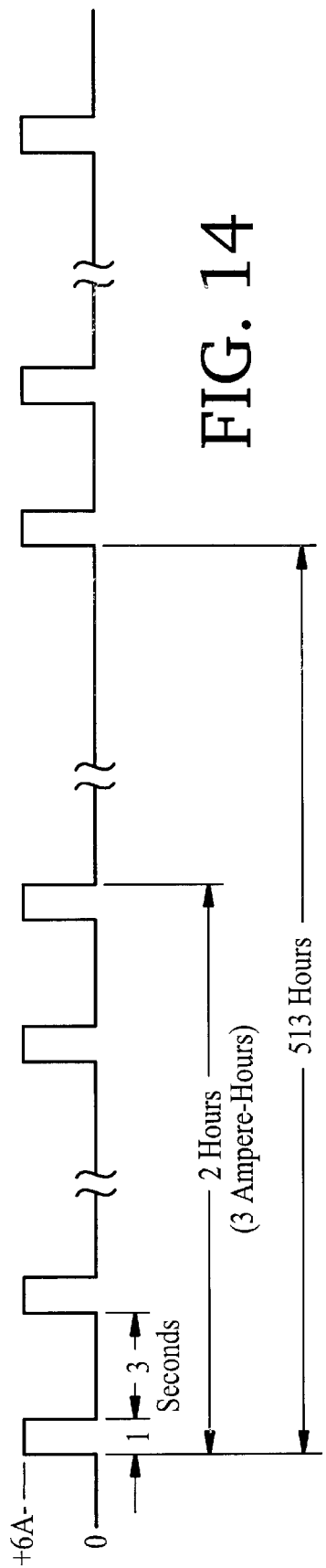
FIG. 14 is a waveform showing a pulse burst charge restoration scheme.

A better alternative is pulse charging in a burst pattern as is illustrated on FIG. 14. Referring back to the example of 6 amperes for 0.5 hours, every 513 hours, this could be modified to 6 amperes for 2.0 hours, 25% duty cycle every 513 hours.

The diagnostic interpretation is enhanced when examining the results of 1800 pulses over a 2-hour span every 513 hours as opposed to 1 pulse every 1026 seconds, while still gaining the benefit of somewhat lower peak voltages. The ability of servicing several or all batteries is not diminished by this procedure.

Figure 15:
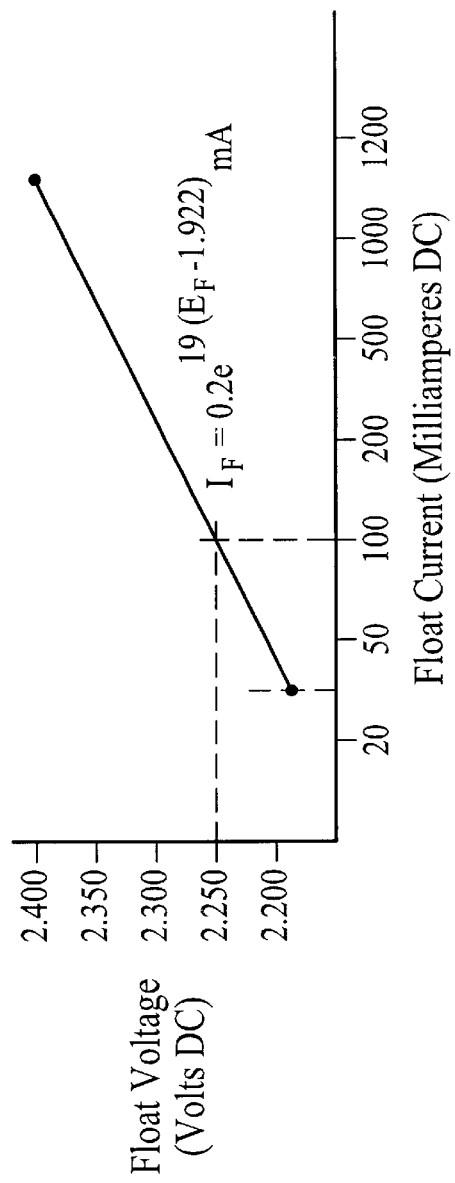
FIG. 15 is a graph of float voltage versus float current for a given cell at a given temperature.

A very careful examination of float current as a function of float voltage and temperature could lead to a reasonable state-of-health assessment, but this is generally not true. First, float current is extremely sensitive to voltage, as is illustrated on FIG. 15. Second, this, in turn, is extremely sensitive to temperature. Third, there is no indication that the negative-to-positive plate polarization is balanced, as there is very little correlation between this balance and float current. A highly polarized positive plate might show the same float current as two moderately polarized plates under the same float voltage.

Traditionally, the best stimulus has been actual discharge testing followed by a complete recharge including an equalization charge phase intended to re-synchronize all of the cells or modules in the system. This is, however, highly undesirable as this activity both reduces the availability of the battery and ultimately the battery's life, due to cyclic use.

It will be understood that the types of data presented above are determined empirically for a given type of battery in a given operating environment.

In the embodiments of the present invention described above, it will be recognized that individual elements and/or features thereof are not necessarily limited to a particular embodiment but, where applicable, are interchangeable and can be used in any selected embodiment even though such may not be specifically shown.

It will thus be seen that the objects set forth above, among those elucidated in, or made apparent from, the preceding description, are efficiently attained and, since certain changes may be made in the above construction and/or method without departing from the scope of the invention, it is intended that all matter contained in the above description or shown on the accompanying drawing figures shall be interpreted as illustrative only and not in a limiting sense.

It is also to be understood that the following claims are intended to cover all of the generic and specific features of the invention herein described and all statements of the scope of the invention which, as a matter of language, might be said to fall therebetween.

I claim:

1. A method of diagnosing state of health of a battery, comprising:

(a) restoring a theoretical amount of charge to a partially depleted battery; and (b) examining how said battery responded to said restoring a theoretical amount of charge to said partially depleted battery to determine said state of health of said battery.

2. A method of diagnosing state of health of a battery, as defined in claim 1, further comprising: providing additional charge to said battery if said state of health of said battery is less than a predetermined level.

3. A method of diagnosing state of health of a battery, as defined in claim 1, further comprising: providing an indication that said state of health of said battery does not fall in a predetermined range after said theoretical amount of charge has been restored to said partially depleted battery.

4. A method of diagnosing state of health of a battery, as defined in claim 1, wherein: said battery is provided as a back-up battery in a float charging system.

5. A method of diagnosing state of health of a battery, as defined in claim 4, wherein: said battery remains on-line during said steps of restoring and examining.

* * * * *

UNITED STATES PATENT AND TRADEMARK OFFICE
CERTIFICATE OF CORRECTION

PATENT NO.    : 6,456,043 B1                                                Page 1 of 1
DATED         : September 24, 2002
INVENTOR(S)   : Eugene P. Finger It is certified that error appears in the above-identified patent and that said Letters Patent is hereby corrected as shown below:

<u>Drawings,</u>
FIG. 2, the numbers on the abscissa of Figure 2 are reversed so that --- +60 --- appears at the left hand side of that figure and --- -20 --- appears at the right hand side of that figure, and should appear as below:

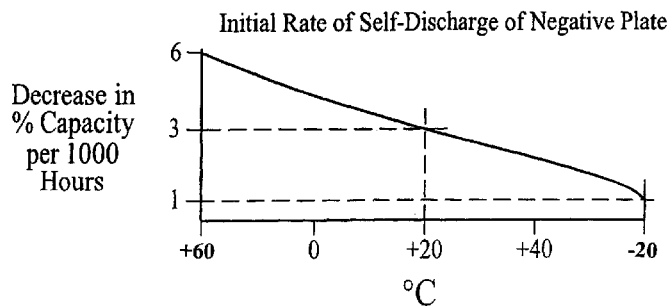

FIG. 2

Signed and Sealed this

Seventh Day of January, 2003

JAMES E. ROGAN
*Director of the United States Patent and Trademark Office*

UNITED STATES PATENT AND TRADEMARK OFFICE
CERTIFICATE OF CORRECTION

PATENT NO.   : 6,456,043 B1  Page 1 of 1
DATED        : September 24, 2002
INVENTOR(S)  : Eugene P. Finger It is certified that error appears in the above-identified patent and that said Letters Patent is hereby corrected as shown below:

Drawings,
FIG. 2, the numbers on the abscissa of Figure 2 are reversed so that --- +60 --- appears at the left hand side of that figure and --- -20 --- appears at the right hand side of that figure, and should appear as below:

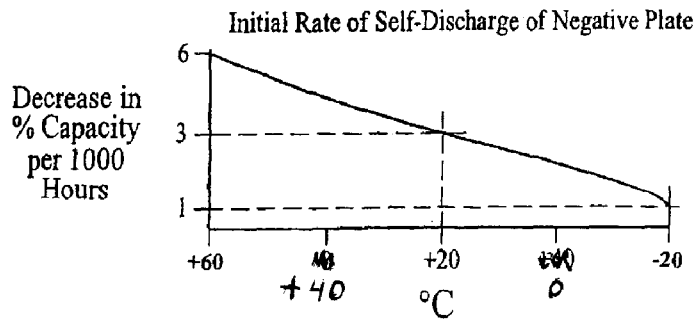

FIG. 2

This certificate supersedes Certificate of Correction issued January 7, 2003

Signed and Sealed this

Twenty-sixth Day of August, 2003

JAMES E. ROGAN
*Director of the United States Patent and Trademark Office*